United States Patent [19]

Seitchik et al.

[11] 4,318,187
[45] Mar. 2, 1982

[54] PHASE TOLERANT MAGNETIC BUBBLE MEMORY SENSE AMPLIFIER

[75] Inventors: Jerold A. Seitchik; Thomas A. Closson, both of Dallas; David B. Oxford, Garland; Stephen R. Schenck, McKinney, all of Tex.

[73] Assignee: Texas Instruments Incorporated, Dallas, Tex.

[21] Appl. No.: 90,959

[22] Filed: Nov. 5, 1979

[51] Int. Cl.³ ............................................ G11C 19/08
[52] U.S. Cl. ...................................... 365/8; 330/256
[58] Field of Search ..................... 365/8; 330/69, 256, 330/289

[56] References Cited

U.S. PATENT DOCUMENTS

| 3,217,183 | 11/1965 | Thompson et al. | 307/355 |
| 3,602,826 | 8/1971 | List et al. | 307/355 |
| 3,842,355 | 10/1974 | Fleagle | 307/362 |
| 4,159,537 | 6/1979 | Schwartz | 365/8 |
| 4,174,539 | 11/1979 | Timm | 365/8 |

Primary Examiner—James W. Moffitt
Attorney, Agent, or Firm—Melvin Sharp; Richard L. Donaldson; Thomas W. DeMond

[57] ABSTRACT

A temperature compensated, phase tolerant sense amplifier for use in a magnetic bubble memory system in which current is applied to the detector resistors only during a bubble detect operation.

5 Claims, 5 Drawing Figures

4,318,187

PHASE TOLERANT MAGNETIC BUBBLE MEMORY SENSE AMPLIFIER

CROSS REFERENCE TO RELATED APPLICATIONS

Related subject matter is contained in the following U.S. Patent Applications which have been filed simultaneously herewith and assigned to the Assignee of the present Application:

Ser. No. 090,958 filed on Nov. 5, 1979 now U.S. Pat. No. 4,261,044 by Oxford et al and entitled "A Temperature Compensated Magnetic Bubble Sense Amplifier"; and Ser. No. 090,960 filed on Nov. 5, 1979 by Closson et al and entitled "A Magnetic Bubble Memory Sense Amplifier Having a Pulsed Current Mode of Operation."

BACKGROUND OF THE INVENTION

1. Field of the Invention

The present invention relates generally to a magnetic bubble memory sense amplifier and, more particularly, to a phase tolerant magnetic bubble sense amplifier.

2. Prior Art Statement

In a typical form, magnetic bubble memory systems include a magnetic bubble memory device in which magnetic bubbles are stored and retrieved under the control of an appropriate control circuit. During the bubble retrieval operation, the control circuit moves the magnetic bubbles stored in the magnetic bubble memory device in a conventional manner so that a previously-stored seqence of bubbles and voids are passed beneath a detector resistor formed on the surface of the device. In response to the movement of a magnetic bubble therebeneath, the detector resistor briefly changes in resistance value, as compared to a dummy resistor which is also formed on the magnetic bubble memory device to have substantially the same nominal resistance as the detector resistor. This induced differential voltage change is detected by a sense amplifier constructed to provide an output signal when the differential exceeds a predetermined threshold voltage. Typically, however, the sense amplifier must identify the desired differential voltage change in the presence of a substantial common-mode signal produced by the access field and other high-frequency noise, as well as an almost unavoidable offset voltage.

In the past, attempts were made to utilize sense amplifiers which were designed for other applications, such as the Motorola MC1444 Plated Wire Sense Amplifier, to perform the magnetic bubble detection function. Dissatisfaction led to the development of special sense amplifiers for use in magnetic bubble memory systems, such as the Texas Instruments SN75281 Bubble-Memory Sense Amplifier. However, such sense amplifiers have been less than fully satisfactory due to excessive offset voltage sensitivity, undesirable input impedance loading characteristics, or other similar deficiencies. More recently developed sense amplifiers, such as those used in the Intel 7242 Formatter/Sense Amplifier, promise some improvement, but have yet to be fully evaluated.

Relevant available materials describing the prior art circuits referenced above are submitted herewith. In addition, an overview of magnetic bubble memory systems and their operations may be found in the following U.S. Pat. Nos. 4,152,776; 4,156,935; and 4,159,537.

SUMMARY OF THE INVENTION

In a magnetic bubble memory system in which magnetic bubbles are moved beneath a detector resistor to change the resistance thereof relative to a dummy resistor under the control of a control circuit, an improved sense amplifier includes an amplifier portion which provides an output signal proportionally greater than the voltages developed across the detector and dummy resistors, a comparator portion for providing a trigger signal indicative of a detected magnetic bubble in response to an applied comparator input signal which exceeds a predetermined threshold level, and a peak detecting portion responsive to the amplifier output signal which couples the amplifier output signal to the comparator portion only when the amplitude of the amplifier output signal is less than a detected local peak. In a preferred form, the peak detecting portion also decouples the amplifier output signal from the comparator portion in response to a clamp signal provided by the control circuit immediately preceding the movement of the magnetic bubbles stored in the magnetic memory device.

It is an object of the present invention to provide an improved sense amplifier for use in the magnetic bubble memory system.

Another object of the present invention is to provide a magnetic bubble memory sense amplifier having improved phase tolerance.

Yet another object of the present invention is to provide a magnetic bubble memory sense amplifier having an improved common mode rejection ratio.

Still another object of the present invention is to provide a magnetic bubble memory sense amplifier having an improved tolerance to the DC offset voltage resulting from mismatch of the detector and dummy resistors of a magnetic bubble memory device.

Other objects and advantages of the present invention will be evident from the following detailed description when read in conjunction with the accompanying drawings.

DESCRIPTION OF THE PREFERRED EMBODIMENT

Figure 1:
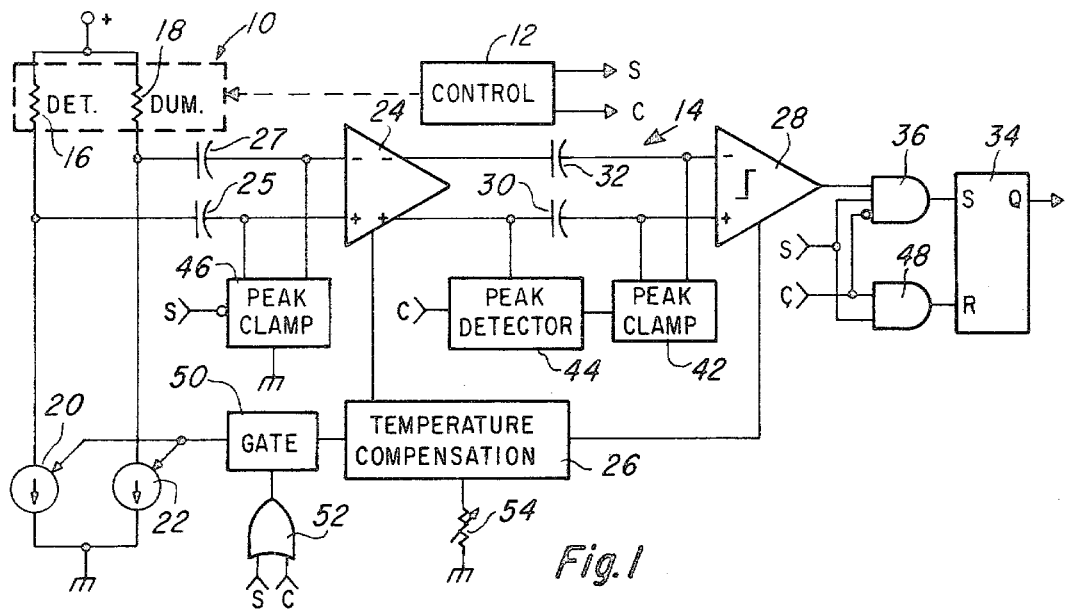
FIG. 1 is a block representation of a magnetic bubble memory system including an improved sense amplifier constructed in accordance with the preferred embodiment of the present invention.

Shown in a simplified schematic form in FIG. 1 is a magnetic bubble memory system comprising a magnetic bubble memory device 10, a control circuit 12, and an improved sense amplifier 14 which is constructed in accordance with the preferred embodiment of the present invention. As is typical in such magnetic bubble memory devices as the Texas Instruments TIB0203 92K-Bit Magnetic Bubble Memory, the magnetic bubble memory device 10 operates under the control of the control circuit 12 to generate and store a sequence of magnetic bubbles and voids, during a write operation. During a subsequent read operation, the magnetic bubble memory device 10 operates under the control of the control circuit 12 to retrieve a stored sequence of magnetic bubbles and voids, and to move the retrieved sequence beneath a detector resistor 16. Typically, the detector resistor 16 is formed on the surface of the magnetic bubble memory device 10 using a conventional magneto-resistive material which changes resistance in response to the movement of a magnetic bubble therebeneath. Thus, the movement of a magnetic bubble beneath the detector resistor 16 causes a brief fluxuation in the voltage developed thereacross via an electrical current flowing therethrough. Ordinarily, the bubble-induced peak-to-peak voltage fluxuation is typically of the order of about 3 mV in the normal loaded operating condition. In an effort to ease the task of detecting the bubble-induced voltage fluxuation, a dummy resistor 18 having substantially the same nominal resistance as the detector resistor 16 is provided on the magnetic bubble memory device 10, and oriented so that the noise-induced fluxuations in the voltages developed across the detector resistor 16 and the dummy resistor 18 tend to cancel. To realize this benefit, the detector resistor 16 and the dummy resistor 18 are generally connected in a bridge network, with the detector resistor 16 and the dummy resistor 18 being connected in series with current sources 20 and 22 which provide current flow through the respective resistors to develop the desired voltages thereacross.

An amplifier 24 is capacitively coupled via input capacitors 25 and 27 to the detector resistor 16 and the dummy resistor 18 so as to be responsive to fluxuations of the voltages developed thereacross. The amplifier 24 provides an output signal which is proportionally greater than the difference in the voltages developed across the resistors 16 and 18. In the preferred form, the amplifier 24 is differential in form so that the output signal provided thereby is differential rather than single-ended. In addition, it is preferred that the gain of the amplifier 24 be established by a temperature compensation circuit 26 in a manner to be described hereinafter.

A comparator 28 is capacitively coupled via coupling capacitors 30 and 32 to the output of the amplifier 24, so that the amplifier output signal may be applied to the comparator 28 as a comparator input signal. The comparator 28 provides a trigger signal for application to a latch 34 via a set gate 36 in response to the comparator input signal exceeding a predetermined threshold level. In the preferred form, the comparator 28 is constructed so that the threshold voltage may be established by the temperature compensation circuit 26 as set forth hereinafter.

Figure 2:
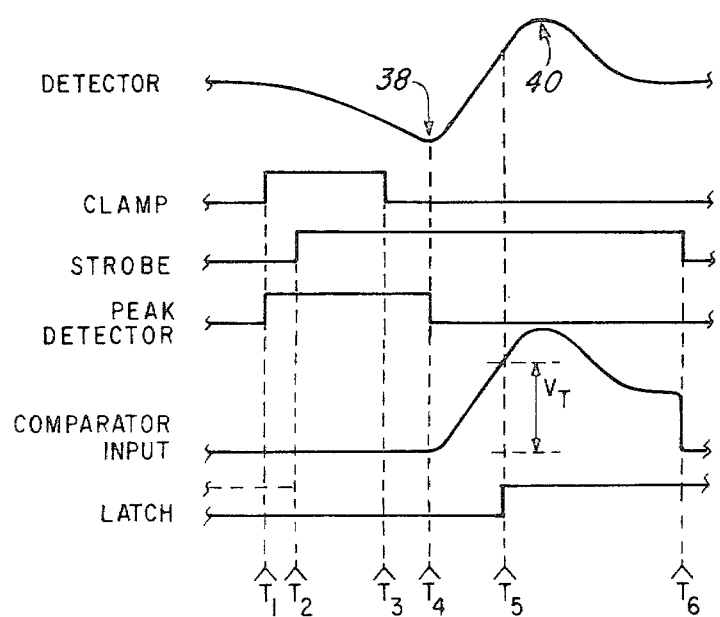
FIG. 2 is a set of wave form diagrams depicting the time-related operation of the sense amplifier of FIG. 1.

Referring in FIG. 2 to the detector wave form as provided by the amplifier 24, it can be seen that the voltage fluxuation developed across the detector resistor 16, relative to the dummy resistor 18, by the movement of a magnetic bubble therebeneath tends to deviate from a nominal voltage toward a first relative voltage extreme or peak 38, and then towards a second opposite relative voltage extreme or peak 40, before again returning to the nominal voltage. In an effort to accurately determine the actual peak-to-peak voltage deviation between the peak 38 and the peak 40, various attempts have been made to isolate the comparator 28 from the amplifier 24 until the occurance of the peak 38. In one form, a peak clamp 42 is provided for clamping the comparator input signal to a predetermined peak clamp voltage in response to a peak clamp signal. In such prior art devices, the peak clamp signal has been provided by the control circuit 12 at a fixed time relative to the controlled movement of the magnetic bubbles. It has been discovered, however, that manufacturing variations present in actual magnetic bubble memory devices 10 tend to induce shifts in the phase of the detector wave form, so that the clamping signal provided by the control circuit 12 typically occurs before or after the actual peak 38. In the preferred form of the present invention, however, a peak detector 44 detects the relative voltage extreme of the amplifier output signal associated with the peak 38, and provides the peak clamp signal for the peak clamp 42 when the voltage of the amplifier output signal is at least equal to the detected relative voltage extreme.

Assuming that the peak detector 44 is constructed to be reponsive to the relatively negative peak 38, it can be seen in FIG. 2 that the voltage of the amplifier output signal increases in absolute value relative to the nominal voltage level until the relative voltage extreme occurs at the peak 38. Thereafter, the voltage of the amplifier output signal is less than the detected relative voltage extreme, causing the peak detector 44 to disable the peak clamp 42. Of course, the peak detector 44 could be constructed to respond in a similar manner to a positive peak if the detector wave form were inverted relative to the nominal voltage level.

In the preferred form, the control circuit 12 does provide a clamp signal (C) of predetermined duration prior to each movement of the magnetic bubbles stored in the magnetic bubble memory device 10. In this form, the peak detector 44 applies the peak clamp signal to the peak clamp 42 in response to the clamp signal, as well as when the amplifier output signal has a voltage at least equal to the detected relative voltage extreme. With reference to FIG. 2, the clamp signal is preferably initiated at a time $T_1$ which is shortly before the actual bubble movement, and terminated at a time $T_3$ which is shortly before the earliest anticipated occurance of the peak 38 at a time $T_4$. In this manner, the peak detector 44 is forced to actuate the peak clamp 42 from a time prior to actual bubble movement to a time shortly before the peak 38, and thereafter actuates the peak clamp 42 only until the actual occurance of the peak 38 at $T_4$. The resulting combination prevents the peak detector 44 from deactivating the peak clamp 42 as a result of detecting any noise-induced relative voltage extremes which may occur between the initiation of the clamp signal at $T_1$ and the termination thereof at $T_3$.

In addition to the peak clamp 42, the preferred form of the sense amplifier 14 includes an input clamp 46 for clamping the voltages capacitively coupled to the amplifier 24 to an input clamp voltage in the absence of a strobe signal (S). In this form, the control circuit 12 provides the strobe signal from a selected time during the period of the clamp signal until a selected time following the clamp signal, the duration of the strobe signal effectively defining the time interval during which the sense amplifier 14 will be responsive to the detector output signal. With refernce to FIG. 2, the strobe signal is preferably initiated at a time $T_2$ shortly after the initiation of the clamp signal and terminated at a time $T_6$ following the anticipated return of the detector output signal to the nominal voltage level. In this manner, the input clamp 46 is enabled except for the time period during which the bubble-induced voltage fluxuation is present in the detector output signal.

The brief period of coincidence of the clamp and strobe signals, between $T_2$ and $T_3$, provides a convenient opportunity to reset the latch 34 via a reset gate 48 which is responsive to the simultaneous presence of both the clamp and strobe signals. Thereafter, the presence of the strobe signal without the clamp signal enables the set gate 36 so that a trigger signal provided by the comparator 28 may set the latch 34. With reference to FIG. 2, the reset gate 48 will reset the latch 34 at the time $T_2$, and the set gate 36 will enable the setting of the latch 34 at the time $T_3$. If the comparator input signal thereafter exceeds the threshold voltage $V_T$, as shown for example at the time $T_5$, the latch 34 will be set and remain set until the next coincidence of the clamp and strobe signals.

In the preferred form, each of the current sources 20 and 22 provides a flow of current through the respective resistor 16 and 18, generally in reponse to control signals provided by the control circuit 12. More particularly, the current sources 20 and 22 provide current at a level determined by a reference voltage provided by the temperature compensation circuit 26, generally under the control of a gate 50 which is responsive to the clamp and strobe signals applied thereto via a NOR gate 52. In this form, the gate 50 will couple the reference voltage to the current sources 20 and 22 when either the clamp signal or the strobe signal is being provided by the control circuit 12. Otherwise, the gate 50 will apply a disable voltage to the current sources 20 and 22 which is selected to disable the current sources 20 and 22, so that no current flows through either the detector resistor 16 or the dummy resistor 18. Thus, current flow through the detector resistor 16 and dummy resistor 18 will be initiated at the time $T_1$ and terminated at the time $T_6$, with no current being provided thereafter until the next occurance of the clamp signal. In this pulsed current mode of operation, resistive heating of the detector resistor 16 and dummy resistor 18 is minimized, thereby reducing the operating margin loss and the temperature-induced drift of the output voltage levels. Preferably, the reference voltage provided by the temperature compensation circuit 26 is selected using an external reference resistor 54, which may be fixed, variable, or temperature responsive, as desired.

Figure 3:
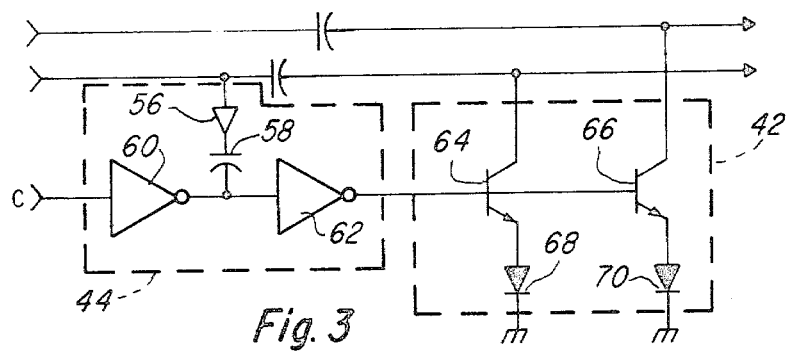
FIG. 3 is a preferred form of the peak detecting portion of the sense amplifier of FIG. 1.

Shown in FIG. 3 is a preferred form for the peak detecting portion of the sense amplifier shown in FIG. 1. More particularly, the peak detector 44 is comprised of a buffer 56 which couples the detector output portion of the differential amplifier output signal to one side of a differentiating capacitor 58. An inverter 60, responsive to the clamp signal (C), has an open collector output coupled to the other side of the differentiating capacitor 58. A second inverter 62 has a clamped input portion coupled to the output of the inverter 60, and an output portion which provides drive current for a pair of clamp transistors 64 and 66 in the peak clamp 42 which are interposed between a ground reference and the sides of the coupling capacitors 30 and 32 connected to the comparator 28. If appropriate, one or more biasing diodes 68 and 70 may be interposed in series with the transistors 64 and 66 to establish the peak clamp voltage at a desired level above the ground reference. In operation, the inverter 60 will maintain the input to the inverter 62 at a low level as long as the clamp signal is applied to the input thereof. However, the buffer 56 and capacitor 58 will continue to hold the input to the inverter 62 low as long as the detector output portion of the differential amplifier output signal continues to move negatively relative to the nominal voltage level, that is, until the time $T_4$ shown in FIG. 2. Thereafter, the relatively positive movement of the detector output portion of the differential amplifier output signal causes the buffer 56 to pull the input to the inverter 62 high via the differentiating capacitor 58. Of course, the inverter 62 will supply drive current to the transistors 64 and 66 only when the input thereto is held low either by the inverter 60 or by the buffer 56 and differentiating capacitor 58.

Figure 4:
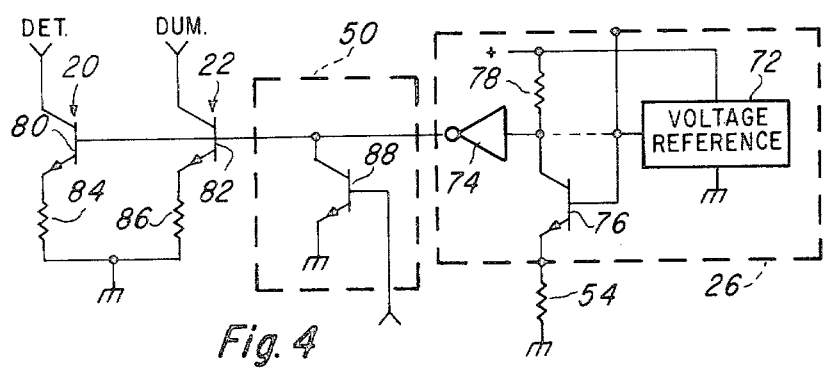
FIG. 4 is a preferred form of the temperature compensation and current control portions of the sense amplifier of FIG. 1.

Shown in FIG. 4 is a preferred form of the temperature compensation circuit 26, the current sources 20 and 22, and the gate 50. In the temperature compensation circuit 26, a voltage reference 72 of conventional form provides a very precise reference voltage relative to the ground reference. Although this reference voltage may be applied directly to the current sources 20 and 22 via a current amplifying buffer 74, it has been found preferable to apply the reference voltage to the base of a temperature-responsive biasing transistor 76 interposed in series with an internal biasing resistor 78 and the external biasing resistor 54, generally between a positive potential and the ground reference. Since the base to emitter voltage, $V_{BE}$, of the transistor 76 varies in a well known manner with temperature, the voltage applied to the buffer 74 via the collector of the transistor 76 varies with the temperature of the temperature compensation circuit 26. Thus, if the temperature compensation circuit 26, and particularly the transistor 76, is disposed relatively close to the magnetic bubble memory device 10, then the reference voltage applied to the current sources 20 and 22 varies in a manner which tends to increase the flow of current through the resistors 16 and 18 as the temperature thereof increases. This increased flow of current tends to counteract the natural reduction in the bubble-induced voltage fluxuations across the resistors 16 at increasing temperatures. A particularly convenient manner for temperature compensating the detector output signal is to provide the resistor 54 in the form of a thermistor which is thermally coupled to the package containing the magnetic bubble memory device 10.

The reference voltage provided by the buffer 74 of the temperature compensation circuit 26 is applied to a pair of transistors 80 and 82 which are connected in series with resistors 84 and 86 to form respective constant current sources 20 and 22. The gate 50 may consist simply of a shunt transistor 88 interposed between the output of the buffer 74 and the ground reference, so that the current provided by the buffer 74 is shunted away from the transistors 80 and 82 when the NOR gate 52 provides drive current in response to the simultaneous absence of both the clamp and the strobe signals.

Figure 5:
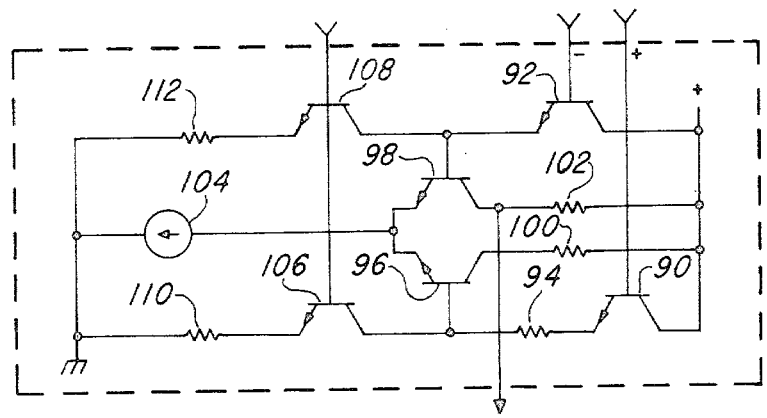
FIG. 5 is a preferred form of a temperature compensated comparator for use in the sense amplifier of FIG. 1.

Shown in FIG. 5 is one preferred form for a temperature compensated comparator 28a which may be used as the comparator 28 in the sense amplifier 14 of FIG. 1. More particularly, the comparator 28a has a pair of input transistors 90 and 92, the bases of which are coupled to the coupling capacitors 30 and 32, respectively. The emitter of the input transistor 90 is coupled via a biasing resistor 94 to the base of a differential transistor 96 and the emitter of the input transistor 92 is directly coupled to the base of a differential transistor 98, while the collectors of each of the input transistors 90 and 92 is connected directly to a positive potential. The collectors of each of the differential transistors 96 and 98 are coupled via respective pull-up resistors 100 and 102 to the positive potential, while the emitters of the differential transistors 96 and 98 are coupled to the ground reference via a constant current source 104. A pair of biasing transistors 106 and 108 are connected in series with biasing resistors 110 and 112, respectively, between the ground reference and the bases of the differential transistors 96 and 98. If the reference voltage provided by the voltage reference 72 of the temperature compensation circuit 26 shown in FIG. 4 is applied to the bases of the transistors 106 and 108, a fixed level of biasing current at a precise bias voltage is drawn from the bases of the differential transistors 96 and 98. As a result, a fixed offset voltage is established by the bias resistor 94 at the base of the differential transistor 96 relative to the base of the differential transistor 98. This offset voltage effectively defines the threshold voltage by which the voltage applied to the base of the input transistor 90 must exceed the voltage applied to the base of the input transistor 92 before the conducting state of the differential transistor 96 changes relative to the conducting state of the differential transistor 98. Thus, the voltage at the collector of the differential transistor 98 may be employed as the trigger signal to indicate when the detector output portion of the differential amplifier output signal, coupled via the coupling capacitor 30 to the input transistor 90, exceeds the voltage of the dummy output portion, coupled via the coupling capacitor 32 to the input transistor 92, by the threshold voltage established by the bias resistor 94. On the other hand, if the temperature compensated reference voltage available at the collector of the transistor 76 in the temperature compensation circuit 26 of FIG. 4 is applied to the biasing transistors 106 and 108, the resultant variation in the biasing currents and voltages applied to the bases of the differential transistors 96 and 98 effectively varies the threshold voltage established by the bias resistor 94. Thus, the threshold voltage can be made to vary inversely with temperature to compensate for the reduction in the bubble-induced peak-to-peak voltage fluxuations with increasing temperature.

Although the improved sense amplifier 14 has been disclosed in detail herein in combination with a particular form of magnetic bubble memory system, it will be clear to those skilled in the art that the present invention may be advantageously employed in other types of systems. It is intended therefore, that variations or changes that may be made in the arrangement or construction of the parts or elements of the improved sense amplifier 14, to adapt the circuit to other uses be considered within the scope of the present invention as defined in the appended claims.

What is claimed is:

1. In combination with a magnetic bubble memory system comprising;
    a magnetic bubble memory device having magnetic bubbles stored therein, a detector resistor which changes resistance in response to the movement of a magnetic bubble therebeneath, and a dummy resistor; and
    control means for moving the magnetic bubbles stored in the magnetic memory device beneath the detector resistor;
an improved sense amplifier comprising:
    current source for providing a flow of current through each of the resistors to develop a voltage thereacross;
    amplifier means for providing an output signal proportionally greater than the difference in the voltages developed across the resistors;
    comparator means for providing a trigger signal in response to an applied comparator input signal exceeding a predetermined threshold level; and
    peak detecting means for detecting the relative peak of the amplifier output signal, and for coupling the amplifier output signal to the comparator means as the comparator input signal when the amplitude of the amplifier output signal is relatively less than the detected relative peak.

2. The sense amplifier of claim 1 wherein the peak detecting means includes:
    coupling capacitance means for capacitively coupling the output signal provided by the amplifier means to the comparator means as the comparator input signal;
    peak clamp means for clamping the comparator input signal to a peak clamp voltage in response to a peak clamp signal and;
    wherein said peak detecting means includes a peak detector means for detecting the relative voltage extreme of the amplifier output signal, and for providing the peak clamp signal in response to the amplifier output signal having a voltage at least equal to the detected relative voltage extreme.

3. The amplifier of claim 2 wherein the control means provides a clamp signal of predetermined duration prior to each movement of the magnetic bubbles stored in the magnetic bubble memory device, and wherein the peak detector means provides the peak clamp signal in response to the clamp signal, as well as when the amplifier output signal has a voltage at least equal to the detected relative voltage extreme.

4. The amplifier of claim 3 wherein the control means provides a strobe signal from a predetermined time during the period of the clamp signal until a predetermined time following the clamp signal, the amplifier further comprising:
    input capacitance means interposed between the resistors and the amplifier means for capacitively coupling the voltages developed across the resistors to the amplifier means; and
    input clamp means for clamping the voltages coupled to the amplifier means to an input clamp voltage in the absence of the strobe signal.

5. The amplifier of claim 1, 3 or 4 wherein the amplifier means provides a differential output signal proportionally greater than the differential of the voltages developed across the resistors, the capacitance means capactively couples the differential output signal to the comparator means as a differential comparator input signal, the comparator means provides the trigger signal in response to the differential comparator input signal having a differential exceeding a predetermined threshold voltage, and the peak detector means provides the peak clamp signal in response to the differential output signal having a voltage at least equal to a detected relative differential extreme.

* * * * *